United States Patent [19]

Kato et al.

[11] 4,314,359

[45] Feb. 2, 1982

[54] SEMICONDUCTOR MEMORY DEVICE

[75] Inventors: Yukio Kato, Kodaira; Atsuo Hotta, Higashiyamato; Teruo Isobe, Hinode, all of Japan

[73] Assignee: Hitachi, Ltd., Tokyo, Japan

[21] Appl. No.: 157,156

[22] Filed: Jun. 6, 1980

[30] Foreign Application Priority Data

Jun. 25, 1979 [JP] Japan .................................. 54-79203

[51] Int. Cl.$^3$ ............................................. G11C 11/40
[52] U.S. Cl. ..................................... 365/179; 357/40; 365/174
[58] Field of Search .......................................... 365/179

[56] References Cited

U.S. PATENT DOCUMENTS 3,786,442 1/1974 Alexander et al. ................. 365/179

Primary Examiner—Terrell W. Fears
Attorney, Agent, or Firm—Craig and Antonelli

[57] ABSTRACT

The invention relates to an improvement in a semiconductor memory device including flip-flop type memory cells, each memory cell consisting of a pair of cross-coupled multi-emitter transistors. The semiconductor memory device of the invention is characterized by including a capacitance added between the collector region and the base region of each of the transistor pair of each memory cell in order to prevent the memory cell from erroneously operating due to α-rays.

3 Claims, 15 Drawing Figures

SEMICONDUCTOR MEMORY DEVICE

BACKGROUND OF THE INVENTION

This invention relates to a semiconductor memory device having extremely high reliability. More specifically, the present invention relates to a semiconductor memory device formed by bipolar transistors.

Generally, a semiconductor substrate having circuit elements such as transistors formed thereon is sealed by a seal member such as an ordinary ceramic package produced by fusing two ceramic sheets together using glass, a ceramic package produced by combining a metal cap with a ceramic sheet, a plastic package or the like. This packaging work provides a semiconductor device. Of the packages used for the semiconductor device, the ceramic material for the ceramic package especially contains several parts per million of impurities such as uranium and thorium.

On the other hand, fine powder of alumina or the like called a "filler" is employed in the material for the plastic package and this filler also contains the above-mentioned impurities.

It is known that these impurities emit α-particles or rays which especially invert the stored data of a dynamic memory circuit formed by MOS type (Metal-Oxide-Semiconductor type) transistors in the semiconductor substrate and cause soft error, as disclosed in "NIKKEI ELECTRONICS", November 27 issue, 1978, pages 123-139 published in Japan, for example.

According to the researches and experiments carried out by the inventors of this invention, it has also been clarified that the soft error due to the α-rays occurs also in a semiconductor device of a static type bipolar memory circuit to be described next.

As illustrated in FIG. 1, a heretofore known bipolar memory cell circuit consists of resistors $R_{21}$ and $R_{22}$, diodes $D_{21}$ and $D_{22}$ and multi-emitter transistors $Q_{21}$ and $Q_{22}$. Common connection line of the diodes $D_{21}$, $D_{22}$ and the resistors $R_{21}$, $R_{22}$ is connected to a word line $+W$. One of the emitters of the transistor $Q_{21}$ is connected to a bit line $B_0$ while that of the transistor $Q_{22}$ is likewise connected to a bit line $B_1$. The other emitters of both transistors $Q_{21}$ and $Q_{22}$ are commonly connected to a data-holding constant current source $I_{ST}$.

The above-described bipolar memory cell circuit is known in the art from U.S. Pat. No. 3,537,078, for example. Data holding is made by a bistable circuit, that is, by means of the stable state of a flip-flop circuit. In other words, when a potential difference occurs between the bases of the transistors $Q_{21}$ and $Q_{22}$, positive feedback is applied to the input due to cross-coupling of the collector to the base so that one of the transistors $Q_{21}$ and $Q_{22}$ having a higher base potential is turned on while the other is turned off, thereby establishing one stable state.

This data-holding capacity is determined d.c.-wise by the potential difference between the bases of the transistors $Q_{21}$ and $Q_{22}$ under the stable state. Also, it is determined a.c.-wise by high frequency characteristics of the transistors such as current amplification factor, high frequency gain-bandwidth product, base resistance, stray capacitance, and so forth and by high frequency characteristics of the resistors ($R_{21}$, $R_{22}$) and diodes ($D_{21}$, $D_{22}$) connected as load to the collectors of the transistors, from the viewpoint that the flip-flop circuit is easier to inverse.

To enhance the data-holding capacity, the high frequency characteristics by these circuit elements may be deteriorated. In order for the speed of the bipolar memory to be increased, however, these characteristics must be improved. In a ultra-high speed bipolar memory, therefore, the data-holding capacity lowers inevitably along with the increase in the speed.

The undesirable data inversion of the bipolar memory resulting from the α-rays may be explained in the following manner.

In the semiconductor substrate forming the bipolar memory circuit, if the α-rays emitted from the package sealing the substrate are incident into the substrate, hole-electron pairs are generated in the incident path of the α-rays due to their energy loss. The hole-electron pairs are collected through the collector-base depletion layer of the transistor and through the depletion layer between the collector region and the substrate and generate a noise current. In FIG. 1, when the transistor $Q_{21}$ is turned on with the transistor $Q_{22}$ off, the collector potential $V_{c1}$ of the transistor $Q_{22}$ is higher than the collector potential $V_{co}$ of the transistor $Q_{21}$ during normal operation as represented by solid line in FIG. 2. However, the hole-electron pairs that are formed upon incidence of the α-rays into the substrate and collected by the collector-base depletion layer generate the noise current $I_n$. This noise current $I_n$ flows through parasitic capacitance $C_{22}$ between the collector-base regions of the transistor $Q_{22}$ and lowers the collector potential $V_{c1}$ of the transistor $Q_{22}$. Consequently, the flip-flop memory cell starts inversing and shifts to one of stable states as represented by dotted line and one-dot chain line in FIG. 2. Thus, there occurs perfect data inversion.

As described above, it has been found that the soft error takes place also in the bipolar memory circuit.

SUMMARY OF THE INVENTION

It is therefore an object of the present invention to obtain a semiconductor memory device which enhances the data-holding capacity of a bipolar memory circuit against noise resulting from physical causes such as the α-rays without sacrificing the high speed performance of the memory circuit.

In accordance with the present invention, in a flip-flop type semiconductor memory device constructed by bipolar transistors each consisting of emitter, base and collector regions, there is formed an additional region to the collector region in order to increase the capacitance of the PN junction between the collector region and the base region of each transistor that forms each memory cell.

Hereinafter, the present invention will be explained in detail with reference to the accompanying drawings.

DESCRIPTION OF THE PREFERRED EMBODIMENTS

Figure 3:
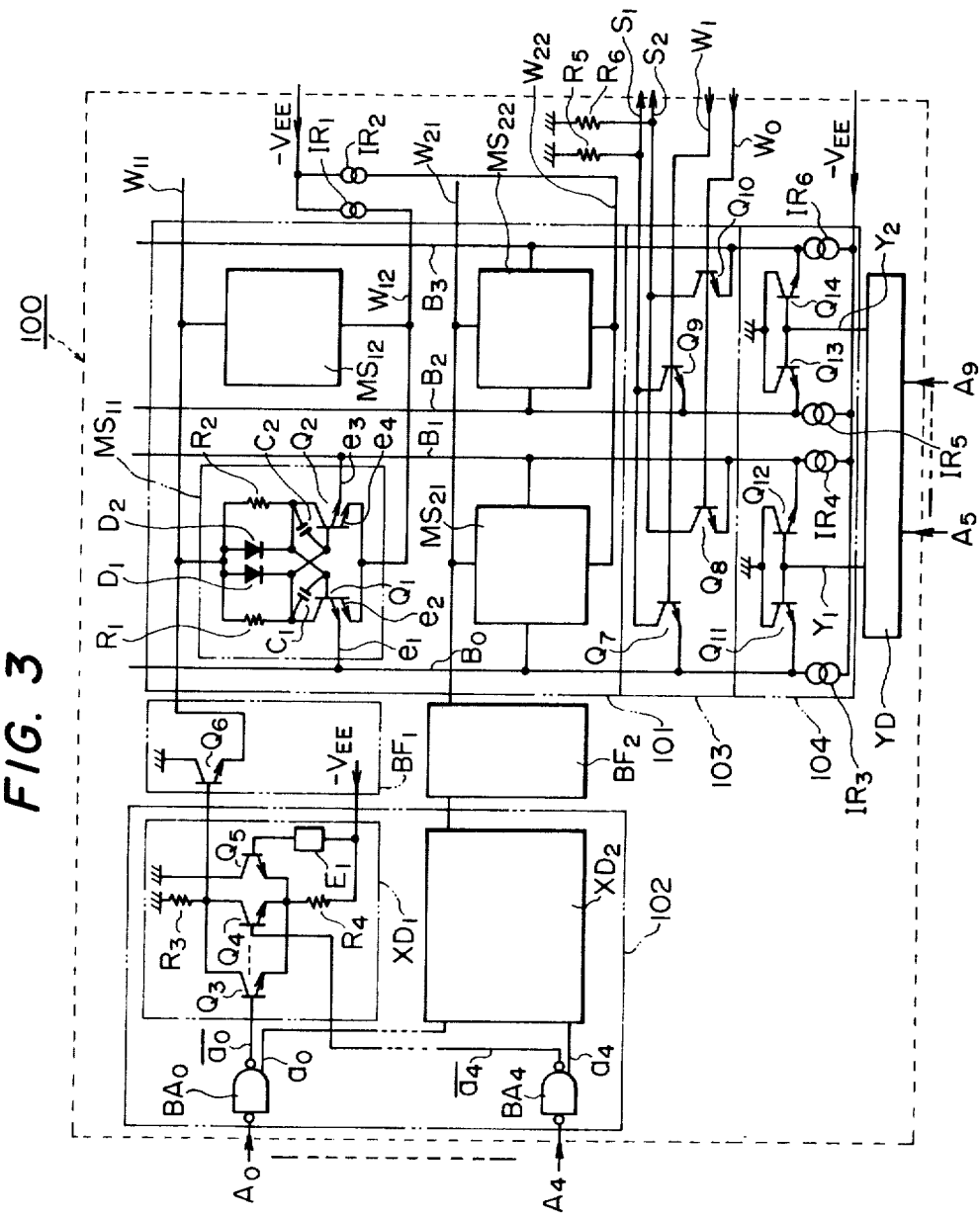
FIG. 3 is a circuit diagram of the semiconductor memory device in accordance with the present invention.

FIG. 3 shows a bipolar memory circuit in the semiconductor integrated circuit form to which the present invention is adapted. In the drawing, the memory circuit 100 is formed on one semiconductor substrate. Reference numeral 101 designates a memory array including plural memory cells $MS_{11}$, $MS_{12}$, $MS_{21}$, $MS_{22}$ arranged along rows and columns, plural word lines (row lines) $W_{11}$–$W_{22}$ and plural digit lines (column lines) $B_0$–$B_3$. Each memory cell consists of a pair of multi-emitter transistors $Q_1$, $Q_2$, a pair of load resistors $R_1$, $R_2$, a pair of diodes $D_1$, $D_2$ and a pair of capacitances $C_1$, $C_2$, the last-mentioned being additionally disposed in accordance with the present invention. Holding current sources $IR_1$, $IR_2$ are connected between lower word lines $W_{12}$, $W_{22}$ and negative power terminal $V_{EE}$.

Reference numeral 102 designates an X-address decoder which receives address signals $A_0$–$A_4$ of plural bits and forms an X-address selection signal for selecting one word line out of the plural word lines of the memory array 101. This address decoder includes plural address buffers $BA_0$–$BA_4$ and plural decoder portions $XD_1$–$XD_2$, each decoder portion including bipolar transistors $Q_3$–$Q_5$. Unlike the bipolar transistors $Q_1$, $Q_2$ used in the memory array 101, these bipolar transistors $Q_3$–$Q_5$ do not have the above-described additional capacitance ($C_1$, $C_2$).

Symbols $BF_1$ and $BF_2$ represent word drivers, respectively, that deliver the output of the decoder 102 to the word lines. These word drivers include bipolar transistor $Q_6$. This transistor $Q_6$ does not have any particular capacitance between its collector and base, either.

Symbol YD represents a Y-address decoder, which receives address signals $A_5$–$A_9$ of plural bits and forms Y-address selection signals $Y_1$–$Y_{32}$ for selecting the plural digit lines of the above-mentioned memory array.

Reference numerals 103 and 104 represent digit selection circuits that select the plural digit lines of the memory array by means of the above-mentioned Y-address selection signals.

A write-read circuit 103 includes transistors $Q_7$–$Q_{10}$ that are so disposed as to correspond to the digit lines $B_0$–$B_3$, respectively. The emitters of the transistors $Q_7$ and $Q_9$ are connected to a pair of digit lines $B_0$, $B_2$ of the two pairs $B_0$–$B_2$ and $B_1$–$B_3$ and their collectors are commonly connected to a sense line $S_1$ with their bases connected commonly to a write line $W_1$. Similarly, the emitters of the transistors $Q_8$ and $Q_{10}$ are connected to the other pair $B_1$–$B_3$ and their collectors are commonly connected to a sense line $S_2$ forming a pair together with the above-mentioned sense line $S_1$ with their bases commonly connected to a write line $W_0$ forming a pair together with the above-mentioned write line $W_1$.

The selection circuit 104 includes transistors $Q_{11}$–$Q_{14}$ that are so arranged as to correspond to the above-mentioned digit lines $B_0$–$B_3$, respectively. The Y-address selection signal $Y_1$ of the Y-address decoder YD is fed to the bases of the transistors $Q_{11}$ and $Q_{12}$ arranged in such a manner as to correspond to a pair of digit lines $B_0$ and $B_1$ and the Y-address selection signal $Y_2$ is likewise fed to the bases of the transistors $Q_{13}$ and $Q_{14}$ arranged in such a manner as to correspond to the other pair of digit lines $B_2$ and $B_3$. The digit lines are connected to the constant current sources $IR_3$–$IR_6$, respectively.

The operation of the bipolar memory circuit will now be explained.

Selection and non-selection of the memory cell of the memory array 101, read and write of the data at the time of selection are determined in accordance with the current switching operations by the transistor of the memory cell connected commonly to the digit, the transistor of the read circuit 103 and the transistor of the selection circuit 104.

That is to say, the word line for non-selection is set to a relatively low potential (hereinafter called "$V_L$") while the word line for selection is set to a relatively high level (hereinafter called "$V_H$") so that the lower potential of the collector potentials of the two transistors $Q_1$ and $Q_2$ of the memory cell connected to this word line is higher than the higher potential of the collector potentials of the two transistors $Q_1$ and $Q_2$ of the memory cell connected to the word line for non-selection.

The potential of the Y-address selection line for non-selection is set to a high potential (hereinafter called "$V_{YH}$") considerably higher than the above-mentioned $V_H$ and the potential of the Y-address selection line for selection is set to a low potential (hereinafter called "$V_{YL}$") lower than the lower collector potential of the two transistors $Q_1$ and $Q_2$ of the memory cell connected to the selected word line.

At the time of reading, the write lines $W_1$, $W_0$ are set to a reference potential (hereinafter called "$V_R$") which is an intermediate potential between the collector potential of the transmitter $Q_1$ and that of the transistor $Q_2$ of the memory cell connected to the word line for selection. At the time of writing, on the other hand, one of them selected in accordance with the data to be written is set to a low level (hereinafter called "$L_{WL}$") lower than the lower potential of the two collector potentials while the other is set to the abovementioned reference potential $V_R$.

When the Y-address selection line $Y_1$ is in the non-selection mode, for example, the high potential $V_{YH}$ of this Y-address selection line $Y_1$ turns on both transistors $Q_{11}$ and $Q_{12}$ of the selection circuit 104 whereby currents are supplied from these transistors $Q_{11}$ and $Q_{12}$ to the constant current means $IR_3$ and $IR_4$. Hence, the emitters $e_1$ and $e_3$ connected to the digit lines $D_1$ and $D_2$ in the memory cells $MS_{11}$ and $MS_{12}$ remain turned off. The transistors $Q_7$ and $Q_8$ of the write circuit 103 also remain turned off. In this case, data holding currents are caused to flow through the memory cells $MS_{11}$ and $MS_{21}$ by holding current means $IR_1$ and $IR_2$.

The memory cell $MS_{11}$ is selected by the word line $W_{11}$ and the Y-address selection line $Y_1$. In this case, the base potential between the transistors whose emitters are connected to the digit lines $D_1$ and $D_2$ keeps the transistors $Q_{11}$ and $Q_{12}$ of the selection circuit 104 in the off state.

For example, the state "1" of the stored data in the memory cell is made to correspond to the case where the transistor $Q_1$ is in the on state while the transistor $Q_2$ is in the off state, and the state "0" is made to correspond to the case where the transistor $Q_1$ is in the off state while the transistor $Q_2$ is in the on state.

When the data of the abovementioned selected memory cell $MS_{11}$ is "1" at the time of reading, the base potential of the transistor $Q_1$ of this memory cell $MS_{11}$ is higher than the base potential $V_R$ of the transistor $Q_7$ so that a current is caused to flow from the emitter $e_1$ of this transistor $Q_1$ to the constant current means $IR_3$. On the other hand, the base potential of the transistor $Q_1$ is lower than the base potential $V_R$ of the transistor $Q_8$ so that a current is caused to flow from the transistor $Q_8$ to the constant current means $IR_4$. This current undergoes a voltage drop across the load resistor $R_6$ connected to the sense line $S_2$. In other words, in accordance with the "1" state of the memory data in the selected memory cell $MS_{11}$, the sense line $S_1$ is set to a high level while $S_2$ is set to a low level.

At the time of writing, the write line $W_1$ is set to the low potential $V_{WL}$ while $W_0$ is set to the reference potential $V_R$, for example. In this case, a current is caused to flow from the emitter $e_1$ of the transistor $Q_1$ to the constant current means $IR_3$ by the current switching action by the transistors $Q_1$ and $Q_7$ irrespective of the on-state and off-state of the transistor $Q_1$ of the memory cell $MS_{11}$. As a result, the transistor $Q_1$ is placed in the on state and the state "1" as the data is written into the memory cell $MS_{11}$.

The circuit operation as described above is analogous to the operation of the known bipolar memory circuit. The characterizing feature of the present invention resides in that the specific capacitances $C_1$ and $C_2$ are added to the collector-base paths of the transistors $Q_1$ and $Q_2$ used in the memory cell of the memory array 101 whereas the transistors $Q_3$ through $Q_{14}$ forming the peripheral circuits of the memory array such as the X-decoder 102, the drivers $BF_1$ and $BF_2$, the Y-decoder YD and the digit line selection circuits 103 and 104 are normal transistors having no specific capacitance in their collector-base paths.

Figure 4:
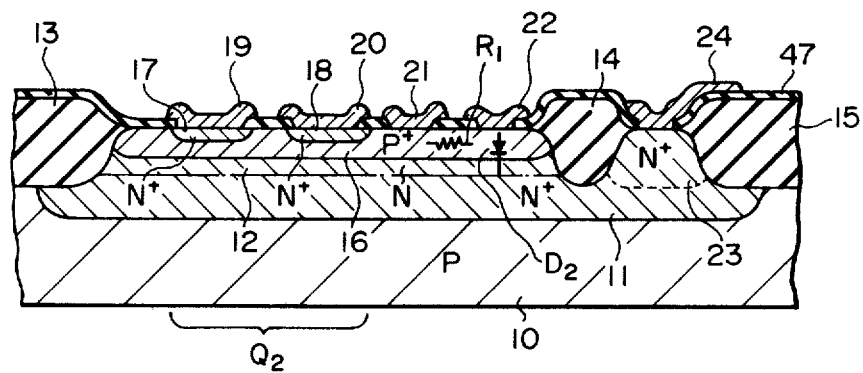
FIG. 4 is a partial sectional view showing the construction of the semiconductor memory device in accordance with the present invention.
Figure 14:
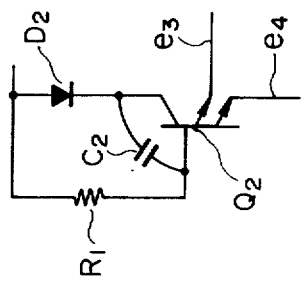
FIG. 14 is an equivalent circuit diagram of the semiconductor memory device of the invention shown in FIG. 4.

FIG. 4 illustrates specifically the structure of the transistor of the memory cell in the memory device shown in FIG. 3. Namely, as shown in the equivalent circuit of FIG. 14, the elements of the memory cell, i.e., diode 2, resistor $R_1$, transistor $Q_2$ and capacitor $C_2$, are formed in one semiconductor region isolated electrically from others. Though not shown in the drawing, such elements as diode $D_1$, resistor $R_2$, transistor $Q_1$ and capacitance $C_4$ are similarly formed in another semiconductor region.

In FIG. 4, a high concentration of N+ type burried layer 11 is formed in the semiconductor substrate 10 by diffusion, ion implantation or the like method. An N type semiconductor layer 12 (hereinafter called "N type layer" for short) having a higher impurity concentration than an N− epitaxial layer, formed beforehand, is formed on the N+ type burried layer 11. In the drawing, the N− epitaxial layer formed beforehand is not shown as the N type layer 12 forms a PN junction in contact with a P+ type base diffused layer.

On the N type layer 12 is formed a P+ base diffused layer 16 which is restricted by integral $SiO_2$ films (field $SiO_2$ films) 13, 14 for isolation. In this P+ base diffused layer 16 are formed a first N+ type emitter diffused layer 17 and a second N+ type emitter diffused layer 18 by the known selective diffusion method.

An aluminum electrode 19 to be connected to the bit line $B_1$ in FIG. 3 is formed on the first N+ type emitter diffused layer 17 and an aluminum electrode 20 to be connected to the word line $W_{11}$ in FIG. 3 is formed on the second N+ type emitter diffused layer 18. An aluminum electrode 21 to be connected to the collector of the transistor $Q_1$ in FIG. 3 is formed on the P+ type base diffused layer 16, and an aluminum electrode 22 to be connected to the word line $W_{11}$ in FIG. 3 is further formed on this P+ base diffused layer 16. On the other hand, an N+ type diffused layer 23 is so formed in the N type epitaxial layer ensompassed by the integral field $SiO_2$ films 14 and 15 as to reach the N+ type burried layer 11. An aluminum electrode 24 to be connected to the base of the transistor $Q_1$ in FIG. 3 is formed in this N+ type diffused layer 23.

In the structure described above, the N type burried layer 12 makes large the parasitic capacitance (junction capacitance) between the collector and base regions of the transistor $Q_2$. As will be explained later, this N type burried layer 12 is formed as the impurity arsenic (As), that has been introduced into the N+ type burried layer by the ion implantation technique before the formation of the N− type epitaxial layer, is allowed to flow out into the N− type epitaxial layer by auto-doping upon the formation of the epitaxial layer. Accordingly, the impurity concentration of the N type burried layer 12 is higher than that of the N− type epitaxial layer. Moreover, the P+ type base diffused layer 16 is formed in such a manner as to reach this N type burried layer 12 so that when the base-collector is reverse-biased, the depletion layer extending from the PN junction between the P+ type base diffused layer 16 and the N type burried layer 12 is restricted by the presence of the N type burried layer 12.

As a result, the capacitance $C_2$ is increased in comparison with a transistor structure not having the N type burried layer 12. Thus, the collector-base junctions of a pair of multi-emitter transistors $Q_1$ and $Q_2$ of the memory cell are increased.

Figure 1:
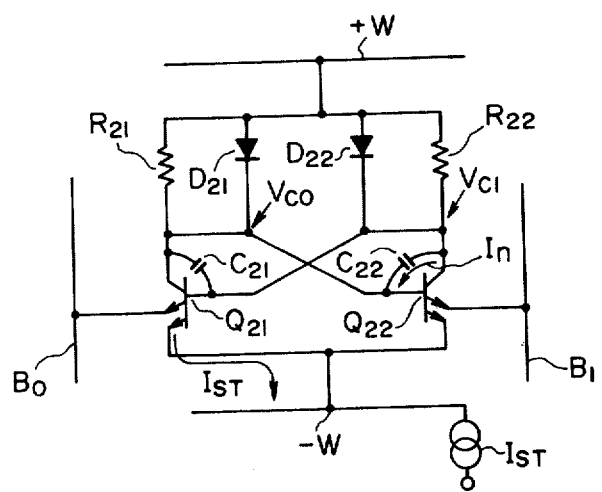
FIG. 1 is a circuit diagram showing the conventional flip-flop type bipolar memory cell.
Figure 2:
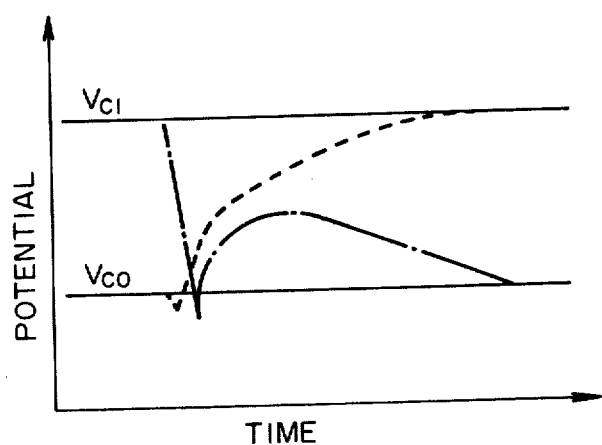
FIG. 2 is a schematic view useful for explaining the data inversion of the memory cell shown in FIG. 1.

By adding the capacitances $C_1$ and $C_2$ of the collector-base junctions, it becomes possible to prevent the inversion of the state owing to the α-rays in the flip-flop type bipolar memory cell such as one explained already with reference to FIG. 2. In other words, the operation marginality is increased with respect to the inversion of the state. Hence, in accordance with the present invention, the state inversion due to the noise such as irradiation of the α-rays emitted from the package becomes difficult to occur.

For, since the time constant between the load resistance ($R_1$, $R_2$) and the collector-base capacitance ($C_1$, $C_2$) becomes great, the time required for the flip-flop circuit of the memory cell to invert from one stable state to the other becomes longer so that the inversion of the state due to the instantaneous noise resulting from the α-rays becomes impossible.

Figure 5:
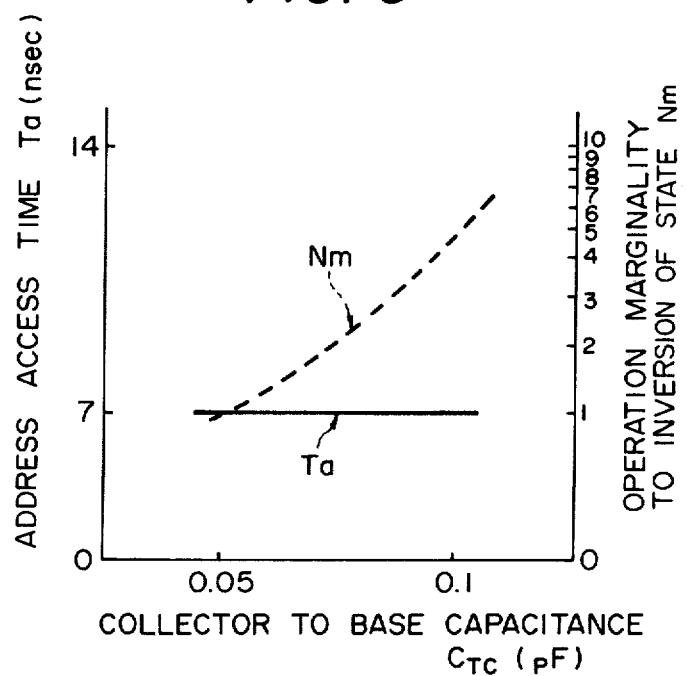
FIG. 5 is a characteristic curve of the semiconductor memory device of the present invention.

In accordance with the present invention, addition of the capacitance exerts hardly any adverse influence upon the address access time of the memory. As shown in FIG. 5, the address access time Ta of the bipolar memory hardly changes when the collector-to-base parasitic capacitance (each of the capacitances $C_1$ and $C_2$ is expressed by $C_{TC}$) changes.

Figure 15:
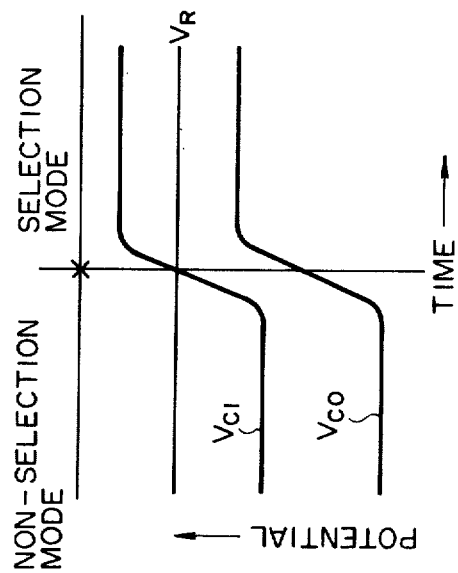
FIG. 15 is a time chart useful for explaining the operation of the memory circuit shown in FIG. 3.

Moreover, as shown in FIG. 4, there is hardly any influence upon the address access time Ta of the bipolar memory cell when the collector-to-base parasitic capacitance ($C_{TC}$) is changed. This is because there is employed a known read circuit system of the type in which the data is read while the selection word line is kept at a potential higher than the other non-selection lines. In this case, when the non-selection mode is changed over to the selection mode, the collector and base potentials of each transistor $Q_1$, $Q_2$ simultaneously irrespective of the collector-to-base parasitic capacitance ($C_{TC}$) as shown in FIG. 15 so that the change of the terminal potential of the collector-to-base parasitic capacitance ($C_{TC}$) of the transistor is substantially zero. On the other hand, the operation marginality to the inversion of the state $N_m$ becomes great as $C_{TC}$ becomes great. That is to say, the operation marginality $N_m$ becomes twice to thrice when $C_{TC}$ increases twice. Here, the operation marginality $N_m$ means the rate of the energy quantity of the α-rays when the inversion of the state is caused in the memory cells.

Next, the fabrication process of the normal transistors ($Q_3$-$Q_{14}$) in the peripheral circuit portion and the transistors ($Q_1$, $Q_2$) of the memory cell circuit formed in the abovementioned embodiment will be explained with reference to the sectional views of FIGS. 6 through 11. In the drawings, symbol $Q_n$ represents the portion where the normal transistors for the peripheral circuit are formed and $Q_a$ does the portion where the transistors of the memory cell are formed.

Figure 6:
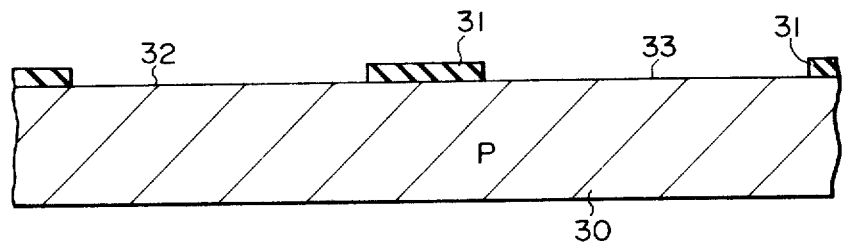
FIGS. 6 through 11 are partial sectional views useful for explaining the fabrication steps of the semiconductor memory device of the invention and showing the section of the memory device at each fabrication step.

(1) As shown in FIG. 6, the $SiO_2$ film 31 formed on a P type silicon substrate 31 is subjected to the selective etching to expose the surface of the substrate 30.

Figure 7:
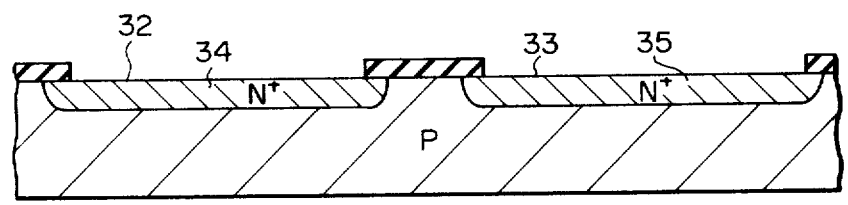

(2) As shown in FIG. 7, anthimony impurity is selectively diffused into the substrate 30 from the exposed portions 32, 33 on the surface of the substrate 30 using the $SiO_2$ film 31 as the diffusion mask, thereby forming N+ type burried layers 34, 35 in the substrate 30.

Figure 8:
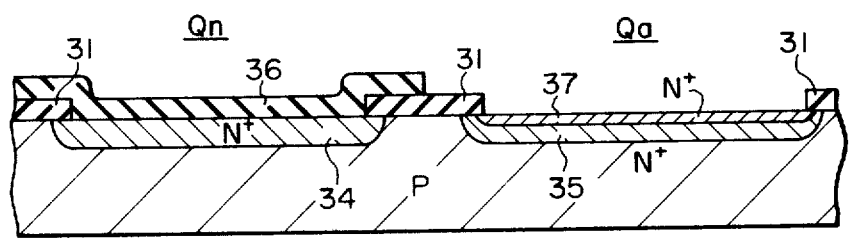

(3) As shown in FIG. 8, the exposed portion 32 on the surface of the substrate at which the transistor $Q_n$ of the peripheral circuit is to be formed is covered with a photo-resit film 36. The ion of arsenic impurity is then implanted into the substrate 30 from the exposed portion 33 on the surface of the substrate 30 at which the transistor $Q_a$ of the memory cell circuit is to be formed and is then extension-diffused by the heat-treatment to form an N+ type layer 37 in such a fashion that the layer 37 is positioned inside the N+ type burried layer 35.

Incidentially, this extension-diffusion may be carried out simultaneously with the subsequent step of forming the epitaxial layer.

Figure 9:
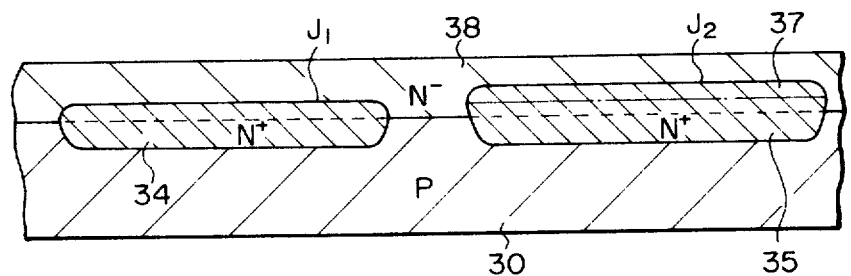

(4) As shown in FIG. 9, after the photoresist film 36 and the $SiO_2$ film 31 are removed, an N− type epitaxial layer 38 is formed over the entire surface of the substrate 30.

During the formation of this N− type epitaxial layer 38, out-diffusion occurs as the arsenic impurity in the N+ type layer 37 is greater in quantity than the antimony impurity in the N+ type burried layer 35. Hence, a boundary portion $J_2$ between the N+ type burried layer 35 and the N− type epitaxial layer 38 is formed at a position closer to the surface of the N− type epitaxial layer 38 than to a boundary portion $J_1$ between the N+ type burried layer 34 and the N− type epitaxial layer 38. In other words, since the N+ type layer 37 is added, the boundary portion $J_2$ is closer to the surface of the N− type epitaxial layer 38 as much. This N type layer 37 functions as the capacitance addition region to increase $C_{TC}$.

Figure 10:
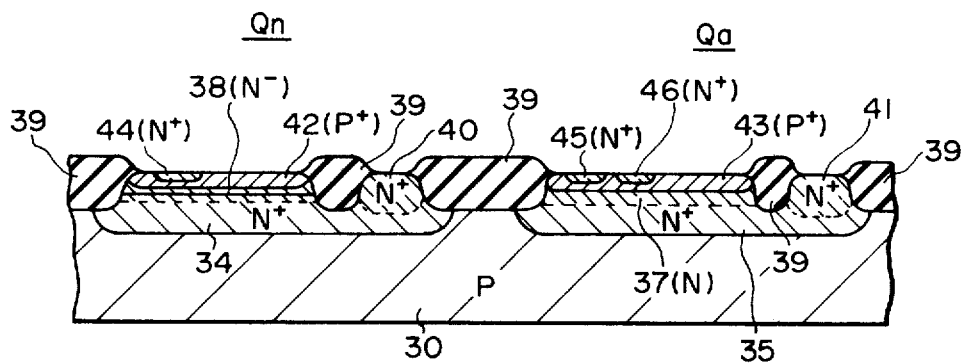

(5) As shown in FIG. 10, an isolation oxide film ($SiO_2$ film) 39 is formed by the ordinary selective oxidation technique. Whenever necessary, a P+ type channel stopper may be formed below this oxide film to prevent the formation of a parasitic channel.

Thereafter, a collector contact extension N+ regions 40 and 41 for the transistor $Q_n$ of the peripheral circuit and for the transistor $Q_a$ of the memory cell circuit, P type base regions 42 and 43 and N+ type emitter regions are formed sequentially and respectively by selective diffusion.

Incidentally, though the P type base region 42 does not reach the boundary portion $J_2$, the P type base region 43 reaches the boundary portion $J_2$ as shown in FIG. 9. Accordingly, the P type base region forms a PN junction (collector junction) together with the N type layer 37.

Figure 11:
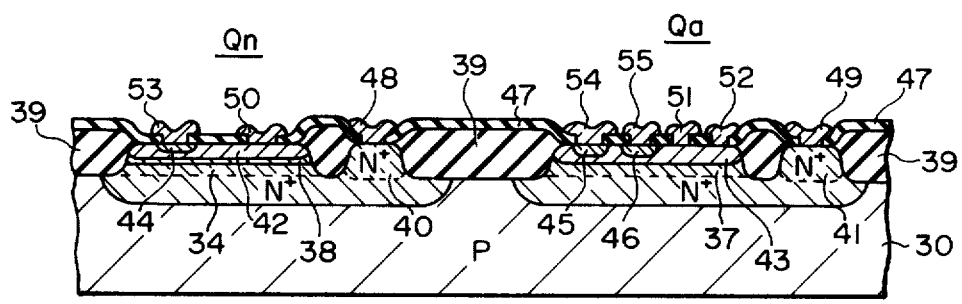

(6) As shown in FIG. 11, the entire surface of the substrate is covered with phospho-silicate glass (PSG) film 47 by chemical vapor deposition (CVD) process. This glass film 47 is selectively removed by etching to expose the surface of the substrate. Collector electrodes 48, 49, base electrodes 50, 51, an anode electrode 52 of a diode and emitter electrodes 53, 54, 55, each consisting of aluminum, are then formed.

In the transistor $Q_a$ of the memory cell circuit, the P+ type base layer (region) 43 and the N+ type layer (region) 37 are brought into contact with each other to increase the junction capacitance ($C_{TC}$) by the fabrication method described above as shown in FIG. 11. In the transistor $Q_n$ of the peripheral circuit, on the other hand, the P+ type base layer (region) 42 is brought out of contact from the N+ type burried layer (region) 34 to restrict the increase in the collector-to-base junction capacitance ($C_J$) as also shown in FIG. 11. In other words, there is a relation $C_{TC} > > C_J$.

The junction capacitance $C_1$, $C_2$ of the flip-flop type bipolar memory cell of FIG. 3 are increased by adapting the transistor $Q_a$, having the increased base-to-collector junction capacitance as described above, to the memory cell circuit, thereby making it difficult for the data inversion to occur by the natural radiation (α-rays). That is to say, the inversion of the collection potentials of both transistors $Q_1$ and $Q_2$ becomes difficult to occur. On the other hand, since the transistor $Q_n$ used in the peripheral circuit does not employ the transistor sturcture used in the memory cell circuit, no increase in the signal propagation delay time occurs due to the increase in the capacitance.

Figure 12:
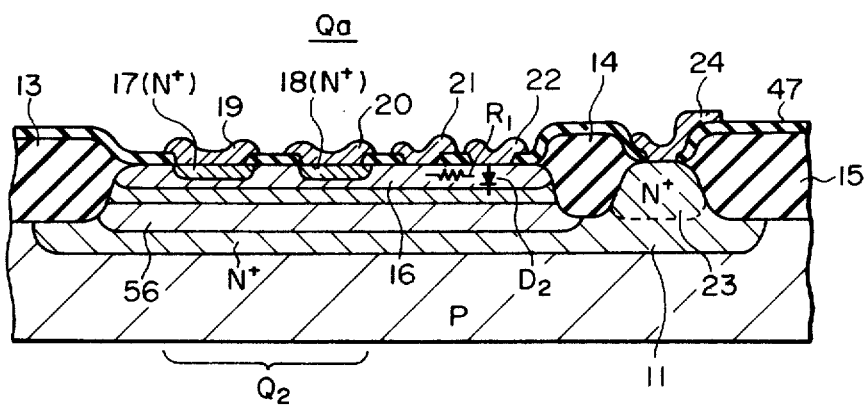
FIGS. 12 and 13 are partial sectional views of the semiconductor memory device to be used in another embodiment of the present invention.

As another embodiment of the present invention, a semiconductor layer 56 substantially approximate to an intrinsic semiconductor may be formed in only the transistor $Q_a$ of the memory cell circuit in place of the capacitance addition region such as the N type layer 12 or the N+ type layer 37, as shown in FIG. 12. In fabricating the semiconductor memory device shown in FIG. 12, the fabrication steps do not at all increase as compared with the abovementioned embodiment. Instead of the N+ type layer 37 shown in FIG. 8, a P+ layer having a relatively lower impurity concentration than the N+ type burried layer 35 is formed by the ion implantation of boron impurity.

In accordance especially with this embodiment, the impurity of the N+ burried layer 35 of the above-mentioned embodiment offsets that of the P+ type layer to form the semiconductor layer 56, which is substantially approximate to the intrinsic semiconductor, thereby establishing the state where an isolation layer is interposed between them. For this reason, it becomes possible to further increase the $C_{TC}(C_1, C_2)$. Hence, the data inversion due to the natural radiation becomes more difficult to occur.

Incidentally, in FIG. 12, reference numerals put to those members other than the intrinsic semiconductor 56 are the same as those of FIG. 4. Hence, the portions having the same reference numerals as FIG. 4 can be explained in the same way as in FIG. 4.

As still another embodiment of the present invention, there may be devised a semiconductor memory device in which the N type layer 12 or the semiconductor layer 56 in FIG. 4 or 12 is selectively formed only immediately below the electrode 22.

Figure 13:
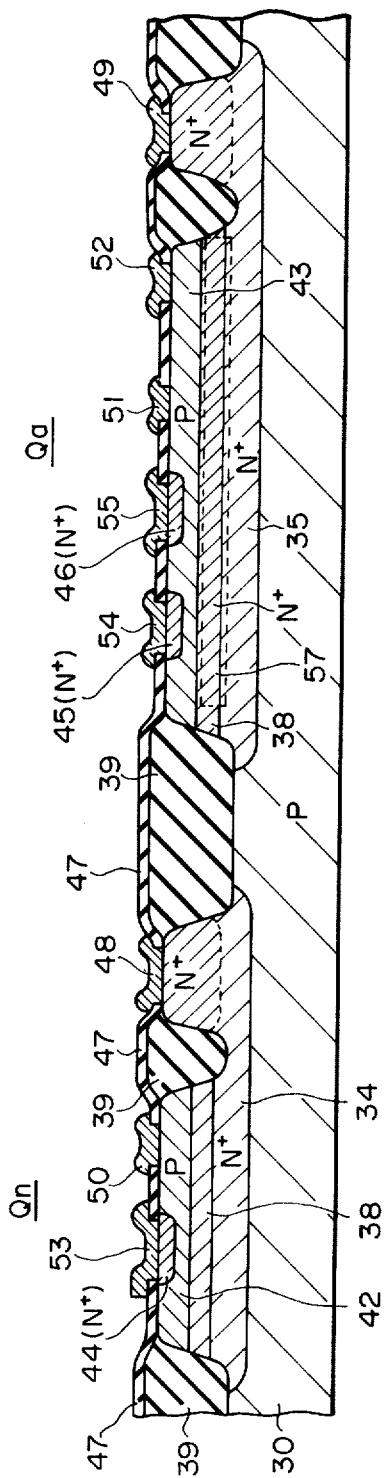

FIG. 13 shows still another embodiment of the present invention. The portions corresponding to those of FIGS. 6–11 are identified by the same reference numerals and the same explanation applies to such portions. In this embodiment, a high concentration impurity region (N+ region ) 57 in the collector region immediately below the base region 43 of the memory cell transistor $Q_a$ is formed by the ion implantation of the N type impurity after the formation of the base region 43. In this case, the formation of the N+ type layer 37 in the burried layer 35 such as shown in FIG. 8 becomes unnecessary.

As described above, in accordance with the present invention, the capacitance per unit area of the PN junction between the collector region and the base region of the transistor of the memory cell circuit becomes greater than that of the transistor for the peripheral circuit.

Although the present invention has been described with reference to the preferred embodiments thereof, it should be noted that the embodiments are merely illustrative but not restrictive and that various changes and modifications may be made within the spirit and scope of the present invention. For example, although the N type epitaxial layer is shown disposed on the P type semiconductor substrate having the N+ type burried layer in the preceeding explanation, the epitaxial layer may be of the P type.

The present invention can also be adapted to a memory circuit in which load means are constructed solely by load resistors ($R_1$, $R_2$) but do not have the clamp diodes ($D_1$, $D_2$).

What is claimed is:

1. In a semiconductor memory device comprising:
   a matrix of memory cells arranged in rows and columns;
   each of said memory cells including a pair of multi-emitter transistors;
   each of said pair of multi-emitter transistors having two emitters, a collector and a base;
   the base and collector of one of said pair of multi-emitter transistors cross-coupled to those of the other;
   one each of the emitters of said pair of multi-emitter transistors connected commonly to a current source;
   the other each of the emitters of said pair of multi-emitter transistors connected to a pair of column lines, respectively;
   the collectors of said pair of multi-emitter transistors connected to row lines via load means, respectively; and
   a peripheral circuit consisting of plural transistors each having an emitter, collector and base, and connected to said row and column lines;
   the improvement wherein capacitance means are added to said pair of multi-emitter transistors of each of said memory cells, respectively in order to increase the collector-to-base capacitance.

2. The semiconductor memory device as defined in claim 1 wherein said capacitance connected between the collector and base of each of said pair of multi-emitter transistors of each of said memory cells has a value greater than the parasitic capacitance between the collector and base of each of said plural transistors forming said peripheral circuit.

3. The semiconductor memory device as defined in claim 2 wherein said pair of multi-emitter transistors forming each of said memory cells and said plural transistors forming said peripheral circuit are formed in one semiconductor substrate, the impurity concentrations of the emitter semiconductor and base semiconductor regions are substantially equal to those in the emitter semiconductor and base semiconductor regions of each of said plural transistors of said peripheral circuit, respectively, and the collector semiconductor region of each of said pair of multi-emitter transistors has a high impurity concentration region formed at least a part thereof having an impurity concentration substantially higher than that of the collector seimiconductor region of each of said plural transistors of said peripheral circuit so that high impurity concentration region serves as said capacitance means.

* * * * *